United States Patent [19]
Gilbert et al.

[11] Patent Number: 5,161,170

[45] Date of Patent: Nov. 3, 1992

[54] DISCRETE AUTOMATIC GAIN CONTROL WITH HIGH STABILITY, HIGH SPEED AND LOW DISTORTION

[75] Inventors: Paul H. Gilbert, Silver Spring; Ronald G. Niemann, Germantown; Robert L. Trapp, Laurel, all of Md.

[73] Assignee: The Johns Hopkins University, Baltimore, Md.

[21] Appl. No.: 465,284

[22] Filed: Jan. 16, 1990

[51] Int. Cl.$^5$ .................................... H04L 27/08
[52] U.S. Cl. ................................ 375/98; 455/249.1
[58] Field of Search ............. 375/98, 97; 358/174, 358/177; 455/138, 232, 240, 234, 239, 249, 253; 330/127, 290; 329/350

[56] References Cited

U.S. PATENT DOCUMENTS 4,864,244  9/1989  Sasaki ........................ 375/98 X Primary Examiner—Benedict V. Safourek
Assistant Examiner—Tesfaldet Bocure
Attorney, Agent, or Firm—Robert E. Archibald; Eugene J. Pawlikowski

[57] ABSTRACT

High speed automatic gain control (AGC) circuitry, capable of use in pulse or CW systems, incorporates hysteresis for improving the stability and distortion characteristics of the AGC. After a gain setting is selected, the built-in hysteresis feature prevents an adjustment in that gain setting until the amplitude of the input signal varies more than a predetermined amount. Sampling of the amplitude of the input signal and gain adjustments are accomplished by digital circuitry. In one embodiment, AGC is on a pulse-to-pulse basis.

8 Claims, 3 Drawing Sheets

DISCRETE AUTOMATIC GAIN CONTROL WITH HIGH STABILITY, HIGH SPEED AND LOW DISTORTION

STATEMENT OF GOVERNMENTAL INTEREST

This invention was made with support under Contract No. N00039-87-C-5301 awarded by the U.S. Navy Department. The Government has certain rights in this invention.

BACKGROUND OF THE INVENTION

1. Field of the Invention

The present invention has specific application in the areas of CW and pulse communications, radar receiver systems, signal acquisition and measurement, RF signal processing, and signal digitization, and in general wherever there is a need for automatic gain control (AGC) with high stability, high speed and low distortion. It is particularly suited for pulse systems where there is a need for signal amplitude control on a pulse-to-pulse basis and with a minimum of signal distortion.

2. Description of Related Art

The related prior art includes diverse circuitry for controlling the gain or attenuation applied to an input signal during the processing thereof. Examples of such prior art include:

Angelle et al U.S. Pat. No. 3,936,819 which teaches circuitry for sampling an input analog signal, applying gain in discrete steps until the signal is within a certain range, and then digitizing the amplified signal;

Schanne et al U.S. Pat. No. 4,540,974 which teaches circuitry useful for adjusting the amplitude of a television signal, including means for taking an input analog signal, digitizing it, and dependent on statistics generated via the digitization process, applying an attenuation or amplification to the signal as needed to place the output signal in an acceptable range; and Baars et al U.S. Pat. No. 4,831,378 which teaches an analog-to-digital converter having an automatic gain control circuit to avoid saturation at the output of the A/D converter.

SUMMARY OF THE INVENTION

The present invention provides automatic gain contol in a manner that offers immunity to noise and signal perturbations, and therefore has improved stability and reduced AGC distortion. This is achieved through the novel use of hysteresis in the gain control circuitry; i.e. once the gain has been set, it will not return to the previous gain setting unless the signal strength returns by at least a preselected fraction of the value of the selected gain step. For example, if gain is controlled in 3 dB steps and half-step hysteresis is selected, the signal strength must change by 1.5 dB or more to cause a change in the gain setting. This significantly reduces the frequency of gain changes and avoids rapid oscillation of gain changes that can otherwise result from small signal changes near a gain setting threshold.

In the present invention, the gain control logic resides in a signal path separate from that of the main signal path. The AGC circuitry comprising the illustrated embodiment of the invention uses a detected logarithmic version of the main signal (tapped off the main signal) as its input to set the gain of the signal in the primary signal path. The AGC circuitry controls the gain of the main signal by means of a digital attenuator connected in the main signal path. Reduction of AGC distortion is further accomplished by using the known attenuator steps for controlling the gain instead of a gain curve. This results in a higher degree of linearity than could be obtained from a gain curve.

Moreover, the AGC circuitry of the present invention is capable of very fast operation, which permits its use in pulse communication systems to set the gain for a given signal pulse based on the level of the previous pulse. In other words, the proposed AGC circuitry determines the gain setting for one pulse based on the sampled signal level occurring at a predetermined time within the previous pulse, and outputs the proper held gain setting to a digital attenuator which implements the gain control function. In one practical application of the present invention, a response time of less than one microsecond has been attained, thus permitting gain control in discrete steps at a one MHz rate. It is anticipated that the AGC function, in accordance with the present invention, may be implemented in a manner which would allow essentially instantaneous control of gain; e.g. a SAW delay line could be placed in the primary signal path to delay this signal and the AGC circuitry could then be set up to operate in a feed forward instantaneous mode. This type of operation would allow the gain setting for a pulse to be based on the actual level of that pulse, and not on the level of the previous pulse.

One additional advantage possessed by the present invention over the above-noted prior art patents is in the nature of the input signal used in setting the gain of the system. Rather than basing gain control upon an integration or statistical sampling of the input signal, which tends to slow down the AGC circuit response to changes in the input signal, the present invention bases its gain setting (for one pulse) upon the level of a sampled data point within the preceding pulse. As noted earlier, this allows the proposed AGC circuit to respond rapidly to an input signal with a varying amplitude on a pulse-to-pulse basis.

In accordance with the foregoing discussion, an object of the present invention is to provide AGC circuitry which is immune to noise and signal perturbations, which improves stability and reduces AGC distortion.

A further object of the invention is to provide discrete gain control circuitry which incorporates fractional, e.g. halfstep, hysteresis at each gain setting to thereby achieve gain control which is immune to noise and signal perturbations and thereby reduce the number and frequency of gain changes, for improved stability and reduced AGC distortion.

Another object of the present invention is to provide AGC circuitry which is fast-operating and applicable to pulse communications, radar, and other signal acquisition and processing systems.

Another object of the present invention is to provide control circuitry capable of adjusting input signal gain on a pulse-to-pulse basis.

These and other objects, purposes and characteristic features of the present invention will be pointed out or become apparent as the disclosure of the invention progresses in conjunction with the accompanying drawings:

DETAILED DESCRIPTION OF THE INVENTION

Figure 1:
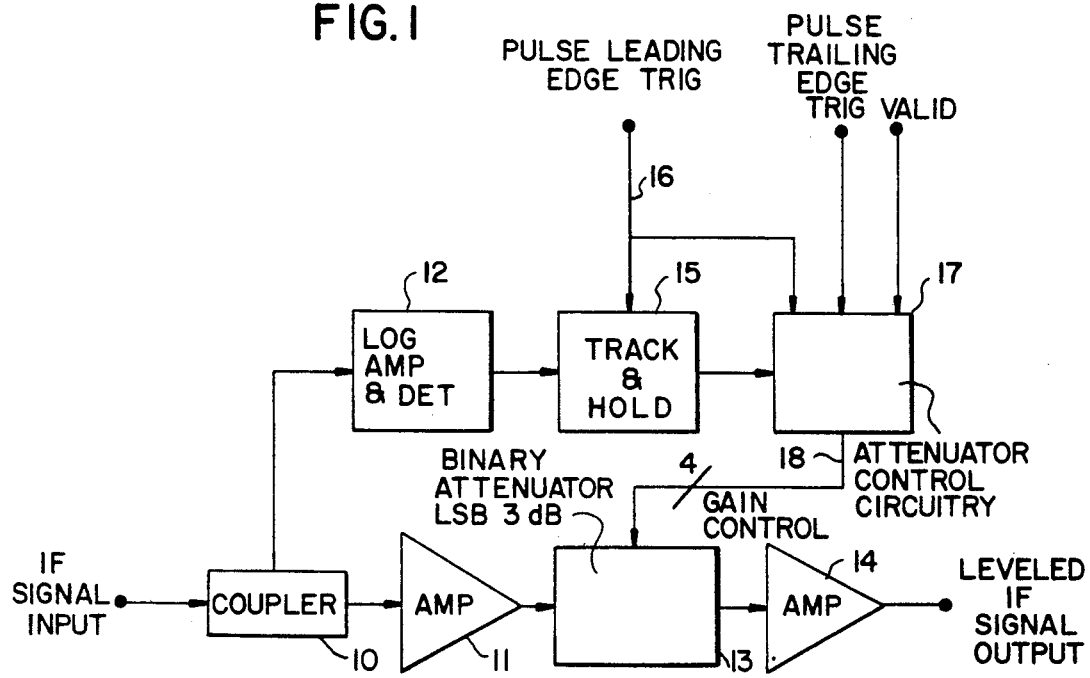
FIG. 1 is a generalized block diagram illustrating the basic circuitry of the present invention as implemented to provide discrete AGC for pulsed IF signals.

One embodiment of the present invention, as applied to discrete AGC for pulsed IF input signals, is illustrated in FIG. 1 of the drawings. More particularly, the input IF signal pulses are coupled, at coupler 10, to amplifier 11 in the main signal path and to logarithmic amplifier and detector 12 in a separate gain control path. The output of amplifier 11 is connected to a 4-bit digital attenuator 13 which has, for example, a 3 dB least significant bit and a total attenuation range of say 24 dB. The attenuator output is amplified at 14.

In the separate gain control path, a detected logarithmic version of the input pulsed IF signal is used to control the digital attenuator 13 and thereby set the gain applied to the input signal. As will be described shortly, this gain control function is implemented by setting the gain for a signal pulse based on the level of the previous pulse. Specifically, the detected logarithmic amplitude of the current input pulse is sampled and held, at track and hold circuit 15, from the pulse leading edge as demarcated by the leading edge trigger (LET) on line 16. This sampled and held amplitude is then compared to separate references for each possible gain setting. This comparison takes place within the attenuator control circuitry 17 to be described in detail hereinafter. Moreover, in accord with the illustrated embodiment of the present invention, hysteresis of 1.5 dB is implemented in each comparator as will be described shortly. The comparator outputs are decoded into a unique 4-bit digital word which is applied on line 18 to control the attenuator 13 after the trailing edge of the pulse has been detected, as demarcated by the pulse trailing edge trigger (TET). The fast attenuator 13 will then have had time to settle to this new value before the subsequent pulse arrives.

Figure 2:
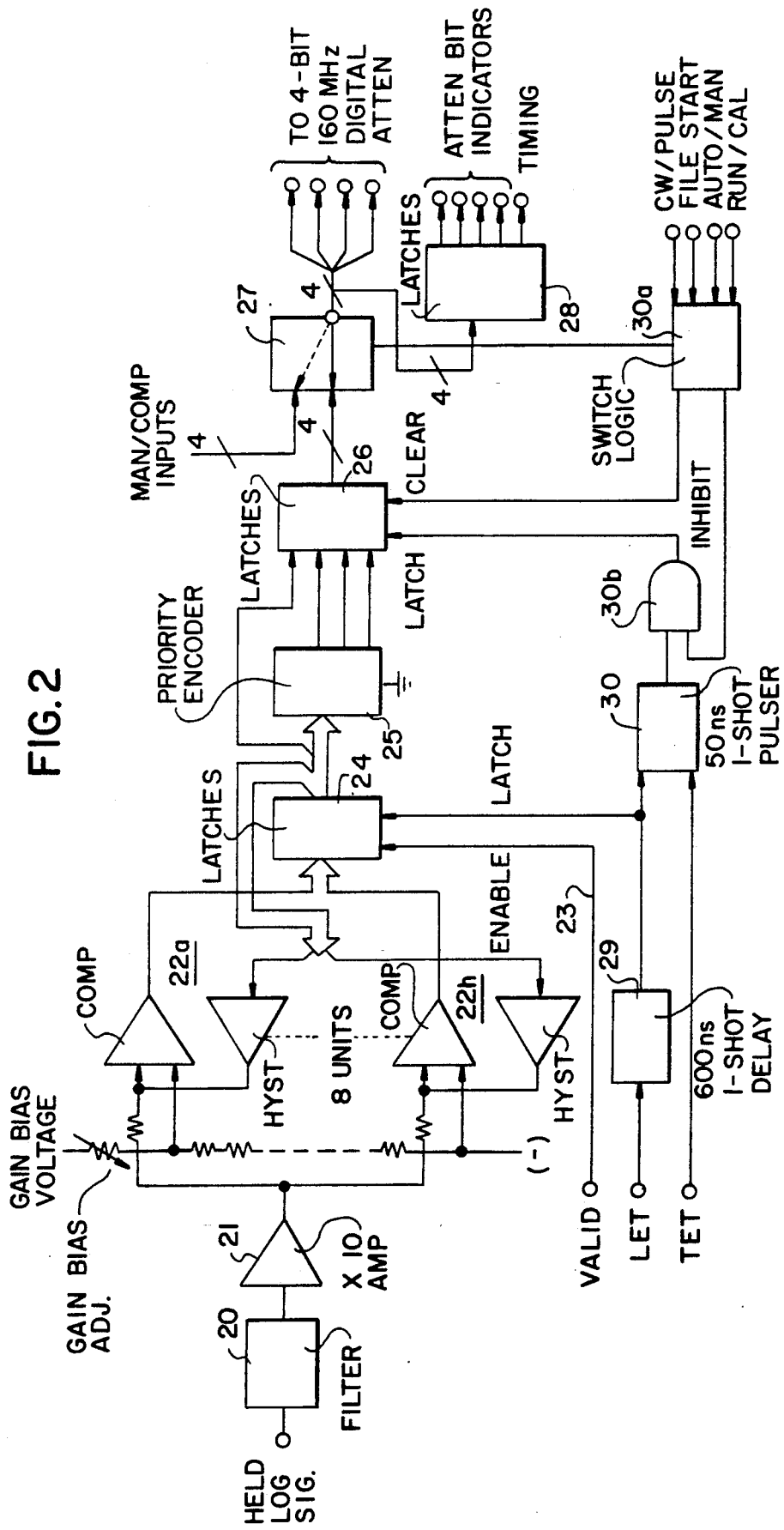
FIG. 2 is a more detailed block diagram of the circuitry comprising the illustrated embodiment of the present invention for applying gain control on a pulse-to-pulse basis.

A more detailed circuit block diagram of the AGC attenuator control circuitry 17 comprising the preferred embodiment of the present invention is shown in FIG. 2 of the drawings, and will now be described by reference to the timing diagram of FIG. 3 and the operational diagram of FIG. 4.

More particularly, the held logarithmic sample of the input pulse is applied through noise filter 20 and amplifier 21 to an 8-stage comparator string 22a through 22h, each comparator stage being supplied with a progressively increased bias voltage corresponding to 3 dB of signal. In this manner, the comparators are used to identify the eight changeover levels shown in FIG. 4. Thus, as the input pulse signal level increases from a low level beginning with the lower comparator 22h, the comparators progressively change state (high to low). If the level of the input pulse signal is greater than a predetermined threshold setting, a true "valid" signal is produced (by conventional circuitry not shown) on line 23 to enable latches 24 and the states of the eight comparators 22a–22h, which indicate the amplitude of the current input pulse, are, after a 600 ns delay (see FIG. 3), read into latches 24 and held. The seven lower comparators are fed into the priority encoder 25. With this arrangement, with a signal below the lowest AGC level, all outputs of priority encoder 25 are high. When the bottom comparator switches to low (at the minimum AGC level), the least of the three output bits of encoder 25 goes to low. As the signal increases, all of the three bits will be low by the seventh AGC switchover and remain there. The latched output of the top comparator 22a, which changes at the eighth switchover, bypasses the encoder 25 and goes directly to the 4-bit latch circuit 26. If the signal pulse width does not exceed 600 ns, as measured by the trailing edge trigger TET (see FIG. 3), this 4-bit data is read, after 600 ns, into latch 26 and stored. If the input pulse is longer, the 4-bit data is read after the end of the pulse. The data from latch 26 is applied through selector chip 27 to the 4-bit attenuator 13 (see FIG. 1) where it provides control of the gain for the next input signal pulse. The selector 27 is provided to select either this automatic control of gain or a 4-bit external source of gain control, which may be either manually or computer selected. The driver 28 provides outputs to indicate the status of the attenuator bits and the timing of any gain change.

Figure 3:
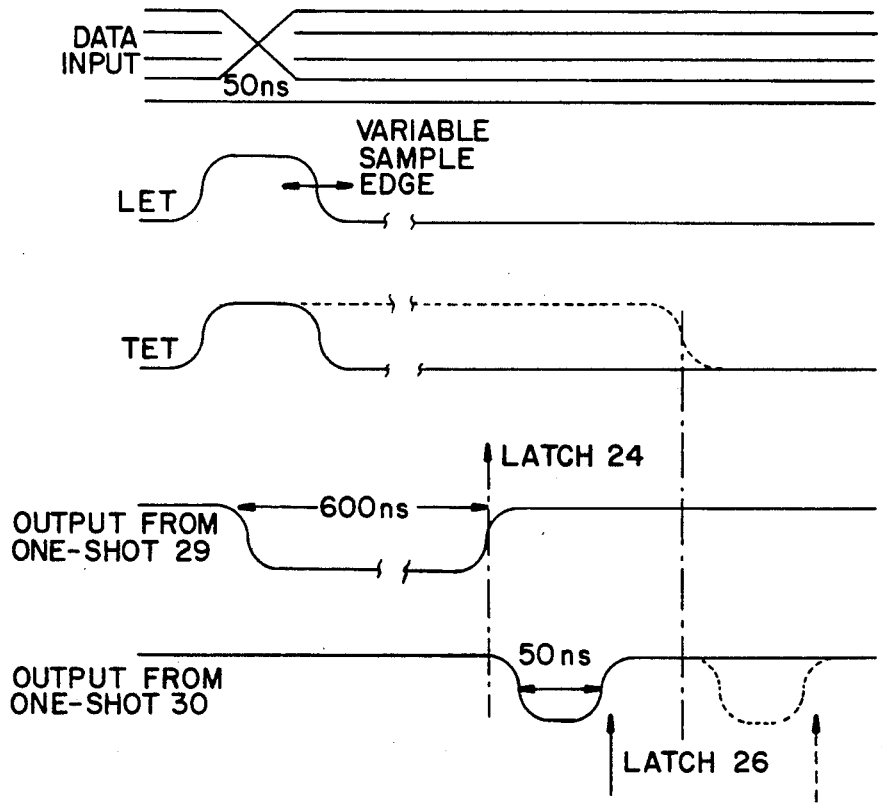
FIG. 3 is a simplified timing diagram relating to the illustrated embodiment of the invention shown in FIG. 2.
Figure 4:
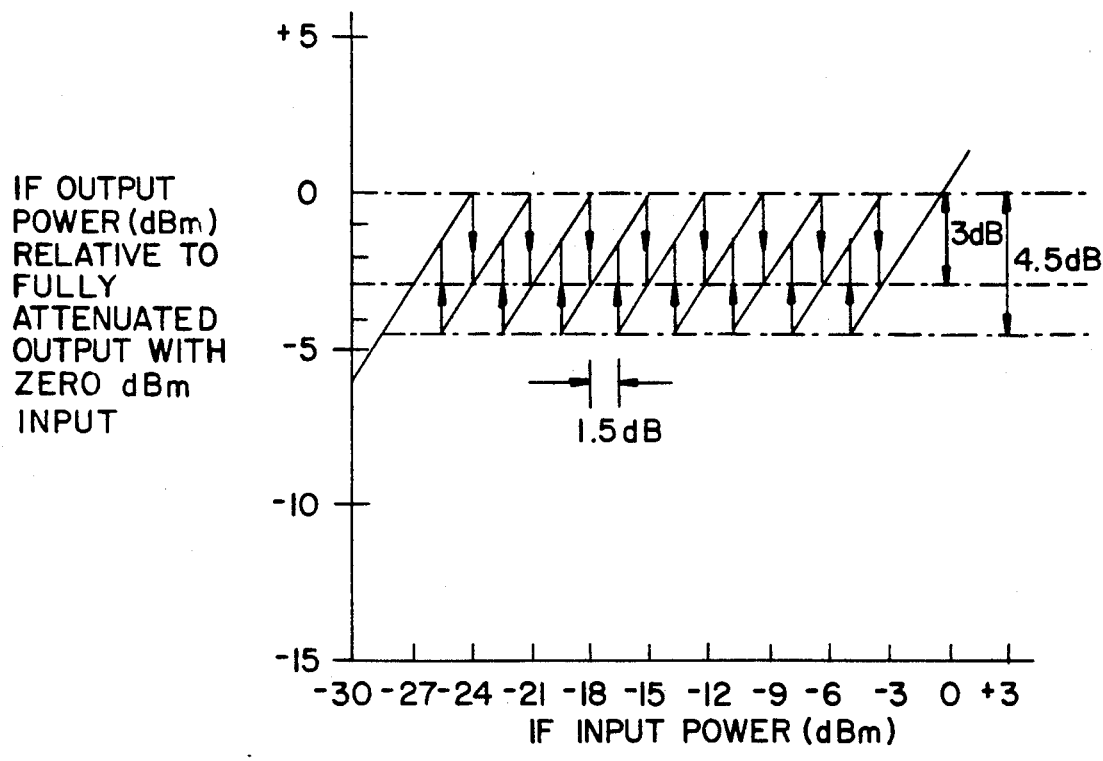
FIG. 4 is a diagram of output vs input signal power illustrating the operation of the gain control provided in accordance with the present invention.

Referring to the simplified timing diagram of FIG. 3, if the minimum input signal pulse repetition interval is expected to be one microsecond (maximum PRF of one MHz) and if 600 ns is allowed for the filtering, transients and settling before using the held logarithmic sample input to the attenuator control circuitry, there is ample time for the priority encoder 25, latch 26 and digital attenuator 13 to utilize the signal level information from one input pulse to control the gain for the next input pulse. More particularly, as shown in FIG. 3, the delayed logarithmic signal is sampled shortly after the beginning of the leading edge trigger LET by a 50 ns gate and held until the next gate. The rising edge of the LET also triggers one-shot 29 which is set to give a rising edge 600 ns later to latch the data content in latches 24, provided the valid signal on line 23 is also true. This leading edge output from one-shot 29 also triggers a one-shot 30 which produces a 50 ns output pulse to latch circuit 26. This timing arrangement allows priority encoder 25 to settle before the encoded data is latched at 26. Since it is undesirable to disturb the pulsed signal by changing the attenuator if a long pulse is still present at 600 ns from the beginning of the LET signal, the TET signal is fed to the one-shot 30 and prevents it from responding to the output from one-shot 29 (50 ns pulse delayed) until after the TET has ended, as is represented by the dashed line in FIG. 3. For a normal short pulse, the data is thus sent to the digital attenuator 13 about 100 ns after the end of the 600 ns output pulse from the one-shot 29; thus allowing ample time for adjusting the digital attenuator 13 prior to receipt of the next input signal pulse.

The switch logic 30a shown in FIG. 2 is used to select the operating mode of the gain control system. In particular, the logic 30a responds to control inputs, as follows:

RUN/CAL: In the CAL mode, the attenuator 13 is fixed at a maximum attenuation. This is done by clearing the latch circuit 26 and making sure its outputs are used by locking the switch 27 in the automatic (lower) position.

AUTO/MAN: In the MAN mode, switch 27 is operated to its upper position to select external inputs for setting gain control.

CW/PULSE: In the CW mode, the attenuator bits are updated until a file is started, at which time the bits are held at their last values. This is done by inhibiting (at gate 30b) the latch inputs to the latch circuit 26.

As noted earlier, a novel feature of the present invention is the use of half-step hysteresis within the comparator string 22a-22h, to provide immunity to noise and signal perturbations, which improves stability and reduces AGC distortion. This is illustrated diagrammatically in FIG. 4 of the drawings. Thus, once a gain has been set for given input signal pulse strength, corresponding say to an input power of −15 dBm in FIG. 4, the gain will not return to its previous setting unless the signal strength changes by 1.5 dB or more. This significantly reduces the frequency of gain changes and avoids the rapid oscillation of gain changes that can be caused by small signal changes that occur when the signal level is near a gain setting threshold.

Figure 5:
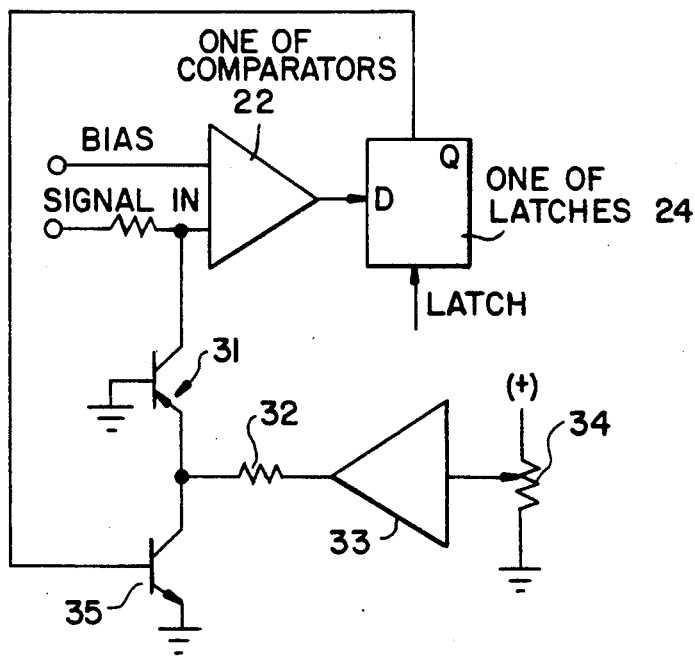
FIG. 5 is a diagram of circuitry for incorporating hysteresis into the automatic gain control system of the illustrated embodiment of the present invention.

FIG. 5 of the drawings shows the circuit arrangement for achieving this hysteresis function on each comparator, in accord with the illustrated embodiment of the present invention. Specifically, this is accomplished by changing the signal's DC level on each of the comparators 22a-22h by 1.5 dB (either adding or subtracting bias as appropriate) when the particular comparator changes state. In the embodiment shown in FIG. 5, this change in bias is achieved by selectively connecting the signal leg of each comparator stage to a constant current source provided by the grounded-base transistor 31. The current of transistor 31 is determined by the voltage applied to its emitter through resistor 32. The resistor 32 is connected to the output of amplifier 33 to whose input is applied a voltage selected by potentiometer 34 that is adjusted to set a 1.5 dB difference in comparator switching level between increasing and decreasing signals. The collector of grounded emitter transistor stage 35 is connected to the juncture of resistor 32 and the emitter of transistor 31, (current through transistor 31 occurs only when transistor 35 is off) while the base of the transistor 35 is controlled by one of the latches 24 so that hysteresis change on the comparators 22a-22h is performed after the circuit 24 (see FIG. 2) has latched the output of the comparators.

Various modifications, alterations and refinements are of course possible in light of the above description and will be obvious to persons of ordinary skill in the art. Accordingly, within the scope of the appended claims, the present invention may be practiced otherwise than as specifically described hereinabove.

What is claimed is:

1. In a system for processing an input signal coupled into a main signal path, automatic gain control (AGC) circuitry residing in a gain control path comprising, in combination, first circuit means for receiving said input signal and sampling its amplitude to control the frequency of changes in gain with reference to designated thresholds, second circuit means connected to said first circuit means and responsive to the sampled value of said input signal for adjusting the gain applied to said input signal in said signal path, third circuit means responsive to the occurrence of a gain adjustment to said input signal for limiting the frequency at which said gain adjustments can be made to said input signal in said main signal path during subsequent variation in the amplitude of said input signal, said input signal is a series of pulses and wherein said second circuit means adjusts the gain of a currently inputted input signal pulse in said main signal path dependent upon the sampled amplitude of the preceding input signal pulse, and wherein said third circuit means includes hysteresis means rendered effective when a gain adjustment has been made for causing said second circuit means to be ineffective to make a subsequent change in gain adjustment until the amplitude of said input signal varies in excess of a predetermined amount.

2. The AGC circuitry specified in claim 1 wherein said first circuit means includes a plurality of comparator stages having a common input to receive said input signal pulse and each biased with a progressively increased bias voltage to produce a corresponding plurality of outputs indicative of the amplitude of said input signal pulse, said second circuit means is a digital attenuator means connected to receive the outputs of said comparator stages and to adjust the gain of said input signal pulses in said main signal path, and said third circuit means comprises a hysteresis circuit connected to each of said plurality of comparator stages for controlling said comparator stages following the operation of said comparator stages to render said comparator stages thereafter unresponsive to changes in the amplitude of the input pulse signal less than a preselected amount.

3. The AGC circuitry specified in claim 2, wherein said first and second circuit means operate to sample the amplitude of one input signal pulse and apply a corresponding gain adjustment prior to processing of the next input signal pulse.

4. The AGC circuitry specified in claim 1 wherein said predetermined amount in excess of which the amplitude of said input signal must vary in order to permit a subsequent change in the gain adjustment is made to render the gain control unresponsive to noise occurring in said input signal when the signal level is near a gain setting threshold.

5. The AGC circuitry specified in claim 3 further including trigger circuit means for generating a leading edge trigger demarcating the leading edge of an input signal pulse, said leading edge trigger initiating the sampling of the amplitude of said input signal pulse, means for storing the resulting outputs of said plurality of comparators and utilizing said stored outputs to control said digital attenuator after a predetermined interval has elapsed following the leading edge of said input signal pulse, said predetermined interval being selected to expire during the interpulse period between said input pulses, whereby said digital attenuator sets the gain for the currently occurring input signal pulse dependent on the amplitude of the preceding input signal pulse.

6. The AGC circuitry specified in claim 5 wherein said trigger circuit means generates a trailing edge trigger demarcating the trailing edge of an input signal pulse being sampled, said trailing edge trigger delaying the use of the outputs from said plurality of comparators to control said digital attenuator until after an input signal pulse being sampled has terminated.

7. The AGC circuitry specified in claim 2, including means for storing said comparator outputs and wherein said hysteresis circuit means changes the input signal's DC level applied to said plurality of comparators after the outputs of said comparators have been stored.

8. The AGC circuitry specified in claim 1, wherein said predetermined amount, in excess of which the amplitude of the input signal must change before a change in gain is permitted by said hysteresis means, is adjustable.

* * * * *